United States Patent [19]

Pascucci

[11] Patent Number: 5,838,619
[45] Date of Patent: Nov. 17, 1998

[54] METHOD AND APPARATUS FOR REDUNDANCY MANAGEMENT OF NON-VOLATILE MEMORIES

[75] Inventor: Luigi Pascucci, Sesto San Giovanni, Italy

[73] Assignee: SGS-Thomson Microelectronics S.r.l., Agrate Brianza, Italy

[21] Appl. No.: 828,039

[22] Filed: Mar. 27, 1997

[30] Foreign Application Priority Data

Mar. 29, 1996 [EP] European Pat. Off. .............. 96830167

[51] Int. Cl.$^6$ ....................................... G11L 7/00
[52] U.S. Cl. ................ 365/185.09; 365/200; 365/230.06
[58] Field of Search .................... 365/185.09, 189.08, 365/200, 230.06, 233.5

[56] References Cited

U.S. PATENT DOCUMENTS

| | | | |
|---|---|---|---|
| 4,365,319 | 12/1982 | Takemae | 365/200 |
| 4,811,298 | 3/1989 | Helwig et al. | 365/200 |
| 4,849,938 | 7/1989 | Furitani et al. | 365/200 |
| 4,858,192 | 8/1989 | Tatsumi et al. | 365/200 |
| 5,414,659 | 5/1995 | Ito | 365/233.5 |
| 5,475,640 | 12/1995 | Kersh, III et al. | 365/230.06 |
| 5,513,144 | 4/1996 | O'Toole | 365/185.09 |
| 5,579,268 | 11/1996 | Seo et al. | 365/200 |
| 5,623,448 | 4/1997 | Koelling | 365/200 |

FOREIGN PATENT DOCUMENTS

| | | | |
|---|---|---|---|
| 0 414 477 | 2/1990 | European Pat. Off. | G06F 11/20 |
| 0 590 608 | 4/1994 | European Pat. Off. | G06F 11/20 |

*Primary Examiner*—Tan T. Nguyen
*Attorney, Agent, or Firm*—Wolf, Greenfield & Sacks, P.C.

[57] ABSTRACT

A redundancy management method, particularly for non-volatile memories, includes the steps of: enabling, as a consequence of the presence of a pulsed read address transition signal of a memory line, and throughout the duration of the pulsed signal, the memory matrix line reading path, and blocking the selection of redundancy lines of the memory; and at the end of the pulsed signal, as a consequence of the absence/presence of a redundancy line read signal, confirming/disabling the selection of the lines of the memory matrix and blocking/releasing the selection of the redundancy lines. A redundancy management architecture for a memory matrix, adapted to perform the above method, blocks or releases redundancy line selection during address switching, but does not block selection of memory matrix word lines.

17 Claims, 4 Drawing Sheets

METHOD AND APPARATUS FOR REDUNDANCY MANAGEMENT OF NON-VOLATILE MEMORIES

BACKGROUND OF THE INVENTION

1. Field of the Invention

The present invention relates to a method and apparatus for managing redundancy in non-volatile memories.

2. Discussion of the Related Art

Non-volatile memories are usually provided with redundancy structures to allow replacement of word lines or bit lines of the memory matrix, which can be defective and therefore not usable either during reading or during programming.

It is known that in a memory including a very large number of lines, some of said lines may be defective due to the presence of corrupted bits. Therefore, in order to ensure maximum reliability of the memory device, a certain number of redundancy lines is provided. These redundancy lines are programmed, during testing of the memory device, with the data that would be meant for the lines that are found to be defective.

The memory matrix usually has an address bus that carries signals representing the address of the line to be read or programmed. Said address bus is connected to a decoder that selects, by multiplexing, the selected line, the "address" whereof is indicated by the address bus signals.

For the redundancy lines, there are redundancy propagation means (PRO RED) allowing access to said lines.

The address represented by the address bus signals is then compared with addresses that are stored in a set of registers that precede the redundancy decoder. If the address of the line represented by the address bus signals matches one of the addresses stored in the set of registers, this means that the desired line is a line subjected to redundancy and therefore the data propagation path must not pass through the memory matrix, but the data must be taken from the corresponding redundancy lines.

The registers that contain the addresses of the lines subjected to redundancy for comparison with the address sent over the address bus are programmable structures that are written when defective lines of the memory matrix are detected during testing of the memory device.

With reference to FIG. 1, which shows a block diagram of a known redundancy management architecture, the reference numeral 1 designates an address bus of signals that represent the addresses of the memory lines selected for reading or programming.

Said address bus 1 is connected both to a register structure 2 and to a pre-decoder 3.

As mentioned earlier, the register structure 2 stores the addresses of lines subjected to redundancy for, comparison with the addresses represented by the signals of address bus 1. The number of registers storing addresses in register structure 2 is equal to the number of redundancy lines.

A redundancy bus 4 then branches out from the register structure 2 and is connected to inputs respectively of redundancy sensing logic means 5 and of redundancy propagation means 6, the output whereof is a redundancy line selection bus 7.

The output of the redundancy sensing logic means 5 is a signal MSL for enabling/disabling line selection of the memory matrix, which is connected to the pre-decoder 3.

The output of the pre-decoder 3 is a decoder bus 8 that is connected to a main decoder 9, the output whereof is in turn a memory matrix line selection bus 10.

FIG. 2 is a more detailed block diagram of the known architecture shown in FIG. 1.

This second figure shows separate structures for the management of the left and right memory half-matrices (not shown); the elements that are shown are therefore identical for the left portion and for the right portion, and the same reference numerals are assigned thereto for the sake of simplicity, said reference numerals also corresponding to the corresponding elements of FIG. 1.

The redundancy management method inserted in a normal memory reading operation can be identified from FIGS. 1 and 2.

The address carried by the address bus 1 is compared with the redundancy addresses stored in the registers of register structure 2, and as a consequence of this comparison the redundancy bus 4 carries signals representing an address that is subjected to redundancy if a match has been found between the address carried by the address bus 1 signals and the address subjected to redundancy stored in the registers of register structure 2.

Said redundancy bus 4, as shown, activates the redundancy propagation means 6 to select the desired redundancy line.

At the same time, a signal for indicating the match or mismatch of the address stored in the registers of register structure 2 with the address carried by the address bus 1 signals is passed through logic gates, generally designated by the reference numeral 5 in FIG. 1 and shown in greater detail in FIG. 2 with the reference numerals 11, 12, 13, 14, 15, and 16.

In order to allow the address of a memory matrix line subjected to redundancy to be recognized as actually matching the address carried by the signals of address bus 1, the output signals from said logic gates must set to a low state the memory matrix line selection enabling/disabling signal MSL. A high signal MSL (=1) enables this selection, while a low signal MSL (=0) disables the selection, at the same time enabling the selection of the lines subjected to redundancy by means of the redundancy decoder 6.

It is thus evident that a normal cycle for reading a memory provided with such a redundancy management architecture can delay data propagation, since the redundancy structures, if selected, block the normal selection of the memory matrix lines. Delays in data propagation, even if the line is actually a line subjected to redundancy, are caused by the logic gates 11, 12, 13, 14, 15, and 16.

Substantially two cases can occur.

In a first case, a redundancy line is selected as a consequence of the sensing of an actual redundancy address (with the consequence that the signal MSL becomes low), whereas in the second case there is a return from a redundancy situation, with the consequent need to normally access the memory matrix, thus bringing the signal MSL to a high state to release the reading of the normal lines of the memory matrix.

Of the two above-mentioned cases, the one that is most heavily penalized in terms of data propagation delay time is the second one, i.e., the selection of a normal memory line on return from a redundancy event.

In this case, the selection of a line subjected to redundancy, by means of the signal MSL=0, in fact blocks any selection of a normal line of the memory matrix.

To allow a normal selection, it is therefore necessary to deselect the redundancy line (bringing the signal MSL to 1) and then activate the normal line of the memory device.

In conventional memories, the drivers of the redundancy lines are the same size as the drivers of the normal lines of the memory and also have the same data propagation characteristics.

The delays introduced by the various selection/deselection logic gates of this conventional circuit sum to progressively delay the respective data.

In particular, between two selections of a normal line of the matrix, the first whereof occurs upon return from a redundancy event, the one that is most heavily penalized in terms of time is the second selection, since it maintains an additional time that is due to the need to deselect the previously activated redundancy path (thus setting the signal MSL to 1).

From what has been mentioned above, it is thus evident that the conventional redundancy management architecture introduces unwanted delays in memory matrix line selection.

One aim of the present invention is therefore to provide an improved redundancy management architecture.

Within the scope of this aim, an object of the present invention is to provide a redundancy management architecture that reduces the data propagation times of the memory, regardless of the previous situation of the memory, i.e., regardless of the presence or absence of a redundancy event prior to the subsequent normal memory matrix line selection event.

Another object of the present invention is to provide a redundancy management architecture that allows to select a redundancy line with propagation times that are equal to, or shorter than, those defined in case of selection of a normal memory line.

Another object of the present invention is to provide a redundancy management architecture that allows selection of a line independently of the events occurring at the time.

Another object of the present invention is to provide a redundancy management method with shorter data propagation times than the conventional management architecture.

Another object of the present invention is to provide an architecture and a method that are highly reliable, relatively easy to execute, and at competitive costs.

SUMMARY OF THE INVENTION

According to one embodiment of the invention, there is provided a redundancy management method, particularly for non-volatile memories, characterized in that it comprises the steps of: enabling, as a consequence of the presence of a pulsed read address transition signal of a line of the memory, and throughout the duration of said pulsed signal, the memory matrix line reading path, and blocking the terminal selection of redundancy lines of the memory; and at the end of the pulsed signal, as a consequence of the absence/presence of a redundancy line read signal, confirming/disabling the selection of the lines of the memory matrix and blocking/releasing the selection of the redundancy lines.

In accordance with another embodiment of the invention, a redundancy management architecture, particularly for non-volatile memories, comprises: a memory matrix line decoder; redundancy propagation means; an address bus that is connected to said main decoder for the selection of a line of a memory matrix and to a register structure that is adapted to store redundancy line addresses, for the comparison of a current address of said bus with the redundancy addresses; and logic redundancy detection means; characterized in that it also comprises: first logic means that receive, in input, a redundancy detection signal produced by said redundancy detection means and a pulsed read address transition signal; and second logic means that receive, in input, said pulsed read address transition detection signal and a redundancy signal, and are adapted to block the selection of the redundancy lines, throughout the duration of said pulsed signal; said first logic means simultaneously enabling the selection of said redundancy lines.

BRIEF DESCRIPTION OF THE DRAWINGS

Further characteristics and advantages of the invention will become apparent from the following description of an embodiment of the architecture according to the invention, illustrated in the accompanying drawings, wherein.

DETAILED DESCRIPTION

Figure 1:
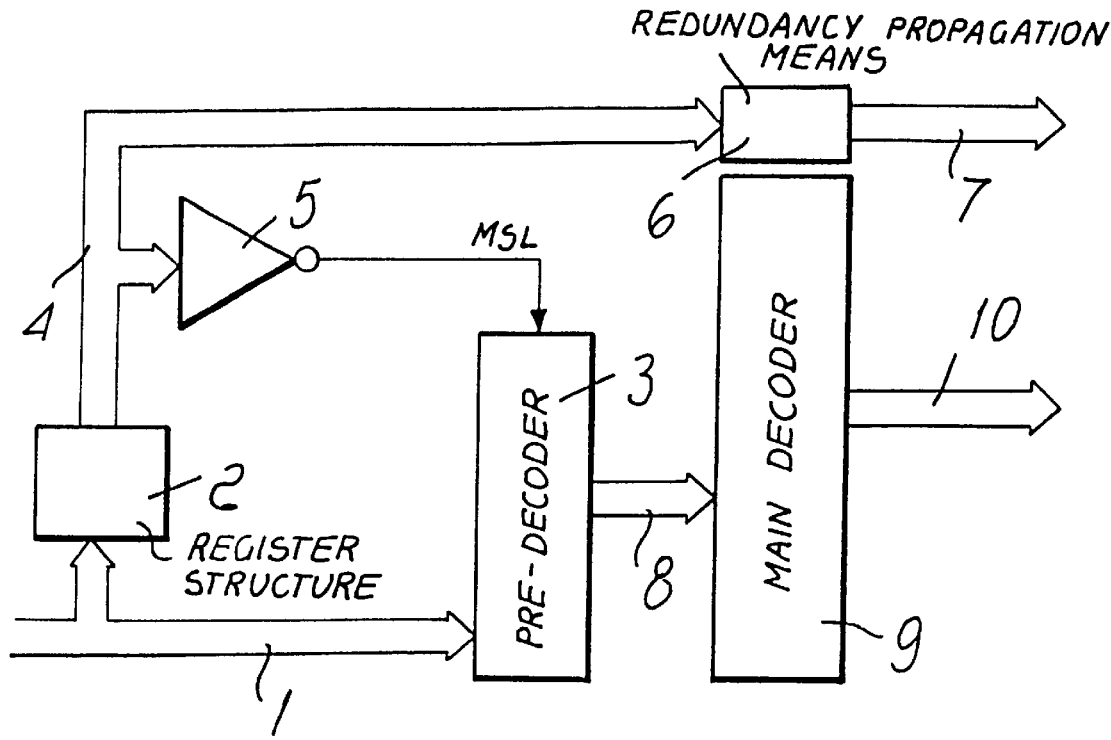
FIG. 1 is a block diagram of a conventional redundancy management architecture.
Figure 2:
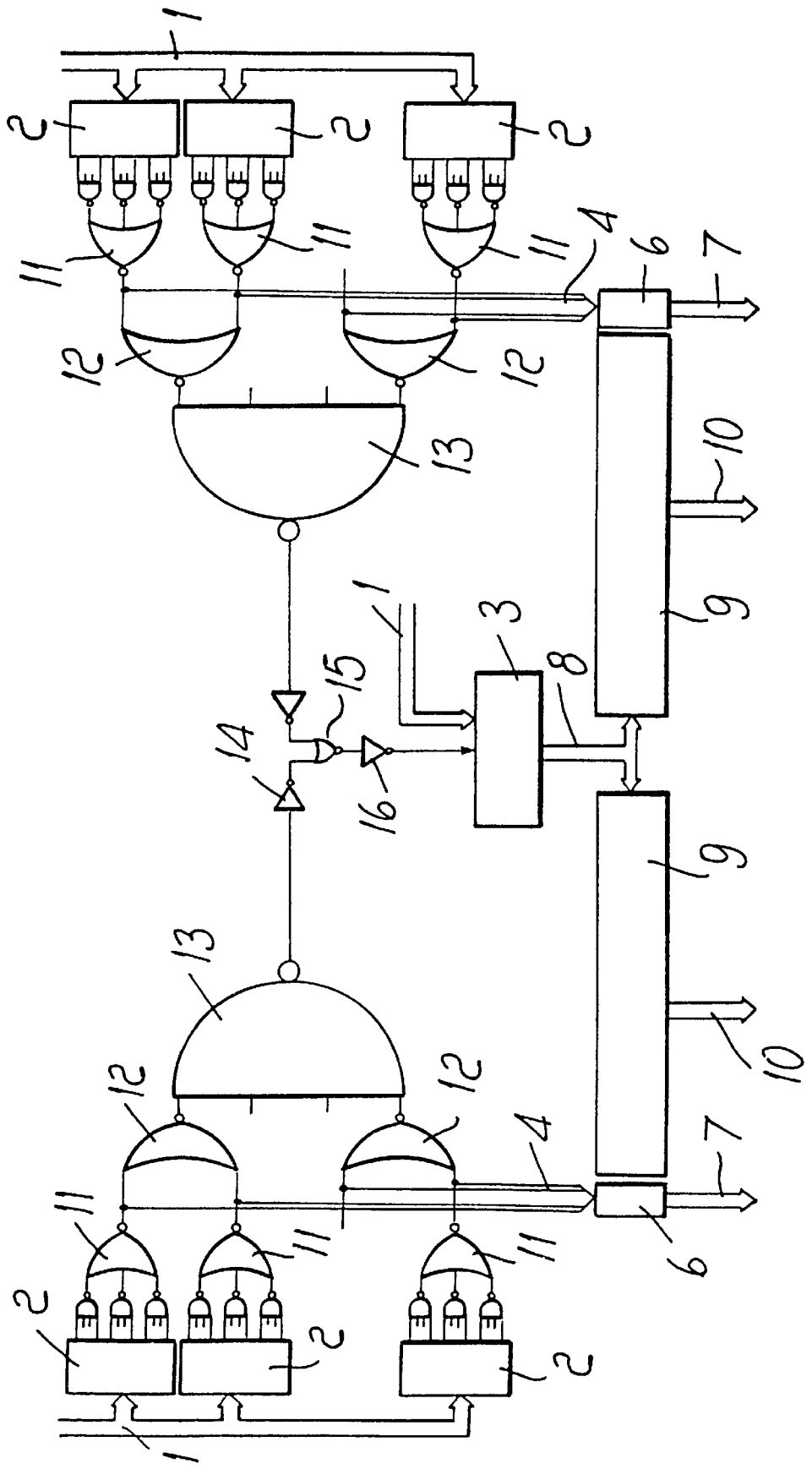
FIG. 2 is a more detailed block diagram of the architecture shown in FIG. 1.

In the following description, the same reference numerals as in the above described FIGS. 1 and 2 will be used for identical elements.

Figure 4:
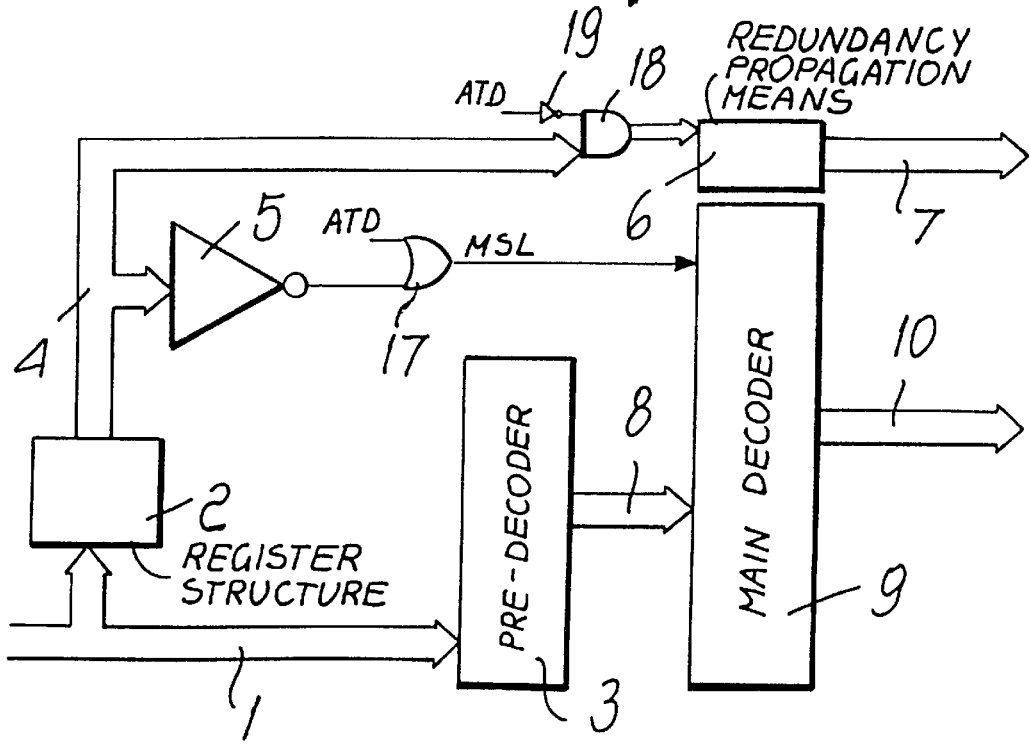
FIG. 4 is a block diagram of a redundancy management architecture according to the invention.

With reference to FIG. 4, the architecture according to the invention comprises an address bus 1 of signals that carry information (the addresses). Address bus 1 is connected both to a register structure 2, which stores the addresses of the redundancy lines, and to a pre-decoder 3.

A decoder bus 8 branches out of the pre-decoder 3 and leads to a main decoder 9. The output of the main decoder is a bus 10 for selecting the lines of the memory matrix.

The output of the register structure 2 is a redundancy bus 4 that carries redundancy information (i.e., signals indicating whether the addresses represented by the address bus 1 signals match or mismatch the addresses stored in the register structure 2). The redundancy bus 4 connects to logic redundancy detection means 5 and to redundancy propagation means 6 adapted to perform the propagation of the redundancy lines by means of the output bus 7.

The output of the logic means 5 is sent to additional logic means 17 that receive as an input the signal ATD, i.e., the address transition detection signal, which serves as a read request signal.

Said logic means 17 are advantageously constituted by an OR gate.

The output of the logic means 17 constitutes the signal MSL for enabling/disabling the reading of a normal line of the memory matrix; said signal is fed to the main decoder 9 to enable/disable access to the memory matrix lines.

The redundancy bus 4 is furthermore sent as an input to the redundancy propagation means 6 after passing through logic means 18 that also receive as an input the inverted signal ATD. The signal ATD is inverted by means of an inverter 19.

Figure 3:
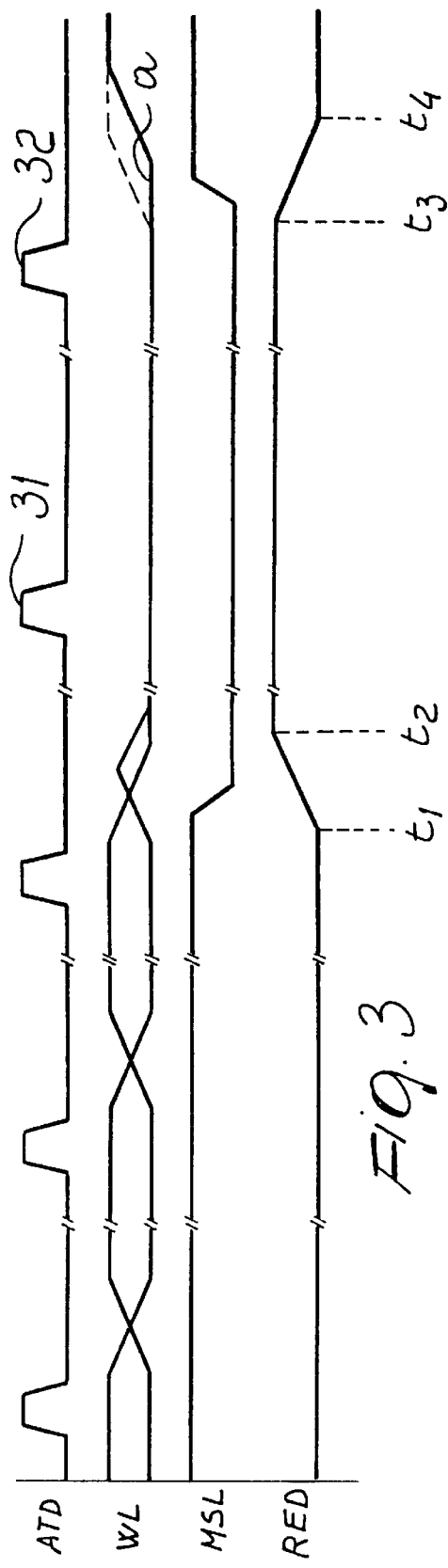
FIG. 3 is a chart of the data propagation timings of the memory in the case of the conventional architecture shown in FIGS. 1 and 2.

FIG. 3 is a chart of the timing of the conventional redundancy management architecture: this chart will be explained in detail hereinafter and compared with the timing chart of the architecture according to the invention, shown in FIG. 5.

Figure 6A:
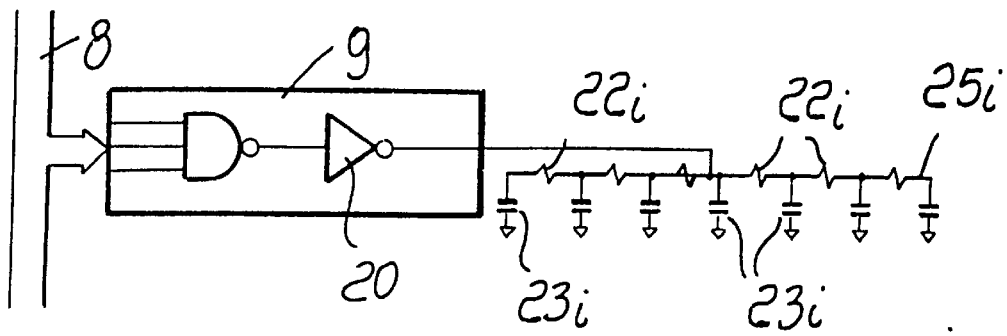
FIGS. 6a and 6b respectively show a first embodiment of the driving of the matrix lines, of a known type, and of the redundancy lines, according to the present invention.
Figure 6B:
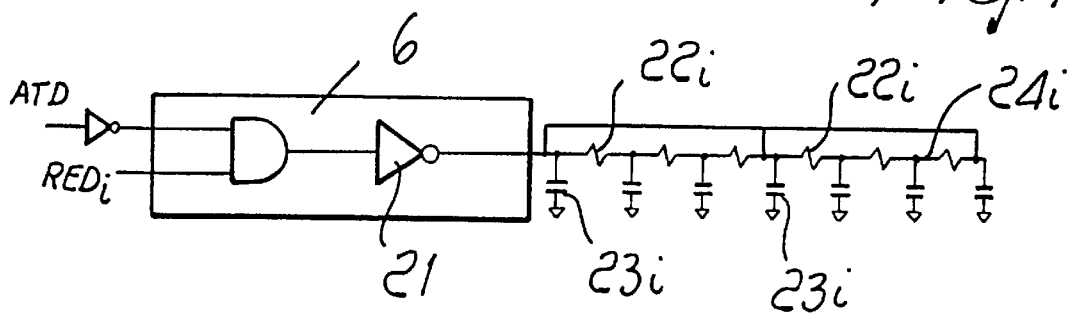

FIG. 6a is a view of a first conventional embodiment of the matrix line driver, whereas FIG. 6b is a view of a first embodiment of the redundancy line driver according to the invention.

Figure 7A:
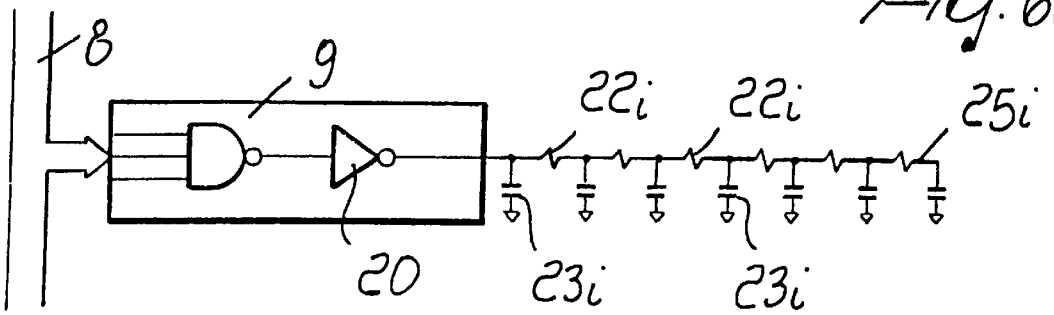
FIGS. 7a and 7b respectively show a second embodiment of the driving of the matrix lines, of a known type, and of the redundancy lines according to the present invention.
Figure 7B:
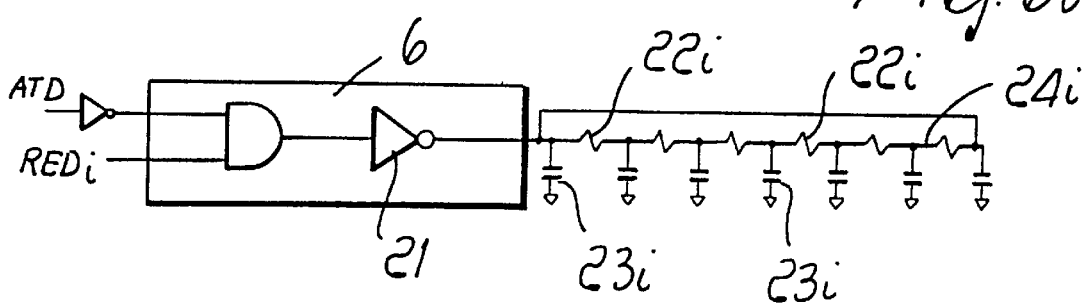

Likewise, FIG. 7a is a view of a second embodiment of the conventional matrix line driver, whereas FIG. 7b is a view of a second embodiment of the redundancy line driver according to the invention.

In the first embodiment, line drivers connect to each matrix line in the center of each said line, whereas in the second embodiment the line drivers connect to each said line at one of its ends.

According to some embodiments of the invention, the drivers 21 of the redundancy lines $24_i$ are larger, than the corresponding drivers 20 of the normal lines $25_i$ of the memory matrix in order to make the rising transitions of the driver output signals faster.

Furthermore, each redundancy line has a delay determined by pairs of resistive and capacitive means, respectively $22_i$ and $23_i$. Therefore, the propagation delay of the generic redundancy line $24_i$ would be given by the sum of the delays caused by the individual pairs $22_i$ and $23_i$, as occurs for the generic normal line $25_i$ of the matrix.

Therefore, in order to reduce the total time constant RC (obtained by multiplying the value of the resistance by the value of the capacitance), the ends of the redundancy line are short-circuited together so that the total delay is halved.

Short circuiting the redundancy lines is possible because the number of redundancy lines is considerably less than the number of memory matrix lines and therefore the space occupied by the shorting of the lines is easily available within the configuration of a memory device.

The above-captioned structure is applied, as shown in FIGS. 6b and 7b, both in the formation of central contacts for the redundancy line, and in lateral contact formation. In lines having a central contact, the shorting is provided by connecting the central point of the line to both ends, whereas in lines having lateral, i.e., end, contacts, shorting is provided by connecting the ends together.

With reference to FIGS. 4, 5, 6b, 7b, and 3, the operation of the architecture according to the invention is as follows.

For the purposes of this discussion, signals are referred to as having a logic high value when they are asserted (=1) and a logic low value when deasserted (=0). Other logic value definitions may be used without departing from the spirit of the invention.

At each pulse of ATD, i.e., at each address transition and therefore at each read request, the main decoder 9 is free to start the native memory matrix line selection transient without initially taking into account the presence or absence of redundancy.

When ATD is high, the redundancy bus 4 is blocked. The AND logic gate 18 receives an inverted ATD signal. Therefore, when ATD is high the output signal from the AND logic gate 18 will be low, regardless of the condition of the redundancy bus 4, i.e., both when a high signal indicating the presence of a line subjected to redundancy is present on said bus, and when a low signal indicating no redundancy is present on said bus.

At the same time, the high ATD signal is provided to the OR logic gate 17, freeing the path towards the main decoder 9, i.e., making the signal MSL go high. In fact, regardless of the condition of the output signal from the logic means 5 (therefore both in the presence and in the absence of redundancy), the signal MSL is always high when ATD is high.

At the end of the ATD pulse (ATD=0), if the redundancy bus 4 carries a high signal indicating the presence of redundancy, then the logic means 18 will produce an output signal for enabling the redundancy propagation means 6 so that the redundancy path is activated for selecting the desired redundancy line.

When there is no redundancy, the redundancy bus 4 carries a low signal, so that the logic means 18 produces an output signal blocking the redundancy path, whereas the signal MSL produced by the logic means 17 is high, so as to allow access to the main decoder 9.

The redundancy management architecture of this exemplary embodiment is configured so as to always enable access to the main decoder 9 regardless of whether there is or not a redundancy situation (an address of a line subjected to redundancy on the address bus 1).

In a system as described above, no idle time is needed to deselect a redundancy line on returning from a redundancy event, since the path for the selection of a normal line of the memory matrix is always activated first. The path for selecting the redundancy line is also activated in parallel, but it is kept blocked throughout the logic high duration of the pulse of ATD.

When the signal ATD returns low, if the redundancy bus 4 carries the high signal, which indicates a match between the address of the line subjected to redundancy and the address carried by the address bus 1, the redundancy path is enabled with the selection of the redundancy line by means of the redundancy bus 7.

The signal MSL always enables reading of a normal line of the memory matrix, until the signal ATD goes from high to low and simultaneously the redundancy bus carries a high signal indicating redundancy.

With reference to FIGS. 6b and 7b, said figures show the I-th redundancy propagation means 6 that drive the I-th redundancy line, the propagation time whereof is reduced, with respect to a normal I-th line (shown in FIGS. 6a and 7a) of the matrix. Propagation time is reduced by shorting together the ends of the line and the intermediate point in the embodiment of FIG. 6b and by shorting together only the ends in the embodiment of FIG. 7b. In this manner, in both embodiments shown, the resistances of the I-th redundancy line are in parallel to each other as a consequence of the shorting.

The driver 21 of the I-th redundancy line is larger than the corresponding driver 20 of the I-th matrix line, resulting in a higher driving speed of the redundancy line with respect to the I-th normal line of the memory matrix.

Figure 5:
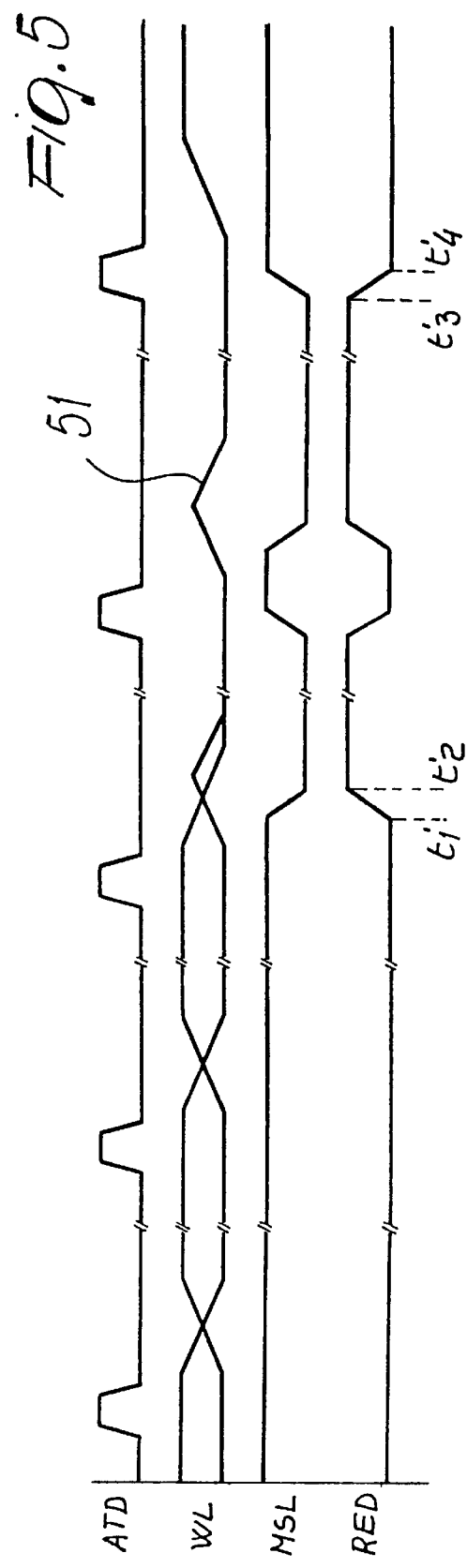
FIG. 5 is a chart of the data propagation timings of the memory in the case of the architecture according to the invention, shown in FIG. 4.

FIG. 3 is a chart of the timings of the read and redundancy signals in a conventional architecture, whereas FIG. 5 is a corresponding chart for an architecture according to the invention.

In FIG. 3, when the redundancy line RED goes from low to high as a consequence of its selection, simultaneously the signal MSL goes low, blocking the selection path of a native memory word line WL. The word line referenced by WL, which, absent redundancy, should be read during pulse 31 of ATD, is stopped. During the period between $t_1$ and $t_2$, WL rises and then falls while the redundancy line RED goes high.

The subsequent read cycle, timed by the pulse 32 of ATD, should cause a normal reading of a normal line WL of the memory, as indicated by the dashed part of WL itself. However, it is necessary to wait for a time that is determined by the time required for the redundancy line to be deselected and for the signal MSL to return high and thus enable the reading of a line WL. This delay is indicated by "a" in the figure.

Furthermore, the rising and falling transitions of a redundancy line, given respectively by the intervals $t_1$–$t_1$ and $t_3$–$t_4$, are slow, since the propagation path of a redundancy line is greater than the path of a normal line WL, because the activation path is longer.

Operation of an embodiment of the invention is now described with reference to FIG. 5.

When the signal ATD goes from low to high and the signal MSL goes from high to low, the redundancy path is enabled when the redundancy line is high. The rising transition of said line is faster than a similar transition performed by the conventional system whose timing is shown in FIG. 3.

In fact, as can be seen in the charts of FIGS. 3 and 5, the transition $t_1'$–$t_2'$ of the redundancy line RED (FIG. 5) has a steeper slope than the similar transition $t_1$–$t_2$ shown in FIG. 3. This is due to the presence of a larger driver for the redundancy line and to the shorting of the resistors of said line.

Between times $t_2'$ and $t_3'$ of FIG. 5 (times $t_2$ and $t_3$ of FIG. 3), the redundancy line is high and the signal MSL is correspondingly low.

Upon the subsequent transition of the signal ATD, and throughout its duration, the signal MSL is set to the high level, thus enabling the selection of a normal line of the memory matrix.

Throughout the duration of ATD, therefore, the corresponding redundancy line is low, since the redundancy path is not activated.

Therefore, when MSL is high there is an attempt to read a normal line WL of the memory that goes from low to high 51.

At the end of the ATD, if the redundancy line is actually selected (high), the line WL returns low, and is thus "suppressed", while the line RED subjected to redundancy takes over.

At the end of the reading of the line subjected to redundancy, and therefore at a subsequent pulse of ATD, a condition of return from a redundancy situation occurs.

The falling times of the redundancy line RED are designated by $t_3'$–$t_4'$ and are shorter than the corresponding times $t_3$–$t_4$ of the conventional system due to the reasons mentioned above.

Assuming that the subsequent reading operation is a normal reading of a line WL, said reading begins at the end of the fall of the redundancy line RED, i.e., at $t_4'$.

In this case, the above-mentioned delay "a" is avoided, because it is not necessary to wait for the deselection of the redundancy line RED, since the signal for enabling the normal reading MSL is already high at this time, thus freeing the path to the main decoder 9.

The delay introduced by halting the redundancy line RED throughout ATD is widely compensated by the higher propagation rate of the redundancy lines according to the present invention and by the lack of delay with which normal reading is reselected when returning from a redundancy situation.

Therefore, each selection of the redundancy lines, although it begins only at the end of the pulse of ATD, occurs with propagation times that are shorter than (or at the most equal to) those of a generic normal line of the memory matrix.

The non-final preselection of a normal line in the initial step of the addressing entails no penalization for the system, since it is promptly blocked before it can reach levels that are significant for real reading and in any case long before full propagation.

With the architecture according to the invention, a redundancy management protocol that does not slow down reading of the memory device has thus been provided.

This protocol can be identified by the following steps:

as a consequence of a pulse of the signal ATD, placing the signal MSL in the high state, independently of a previous event of the memory, to enable the reading path of a normal line of the memory matrix;

keeping said signal MSL high throughout the duration of the pulse of ATD, thus blocking at the same time the selection of a line subjected to redundancy;

at the end of the pulse of ATD, if redundancy is detected, enabling the redundancy path, blocking the native selection path and halting the initiated selection of a normal line; if no redundancy is detected, continuing the native selection that has already started.

In practice it has been observed that the architecture and the method according to the invention fully achieve the intended aim, since they reduce the propagation times for the selection of the lines of the memory matrix, making said selection times independent of the previous events. Therefore, in case of return from a redundancy situation, it is no longer necessary to wait for the deselection of the redundancy line before being able to select a normal memory line.

Furthermore, each selection of the redundancy line, despite being performed at the end of each pulse of ATD, occurs with propagation times that are shorter than, or equal to, those for the immediate selection of a generic normal line of the memory matrix.

To conclude, an architecture for the selection of redundancy and normal lines has been provided which is independent of the events occurring at the time and has, at the same time, a minimal effect with respect to the propagation times.

The architecture according to the present invention can also be used in case of packet redundancy management, i.e., for column redundancy performed by replacing an entire set of columns of the memory matrix with a set of redundancy columns.

The architecture thus conceived is susceptible of numerous modifications and variations, all of which are within the scope of the inventive concept.

Thus, for example, the pre-decoder 3 can be omitted and in this case the address bus 1 is directly connected to the main decoder 9.

Finally, all the details may furthermore be replaced with other technically equivalent elements.

Having thus described at least one illustrative embodiment of the invention, various alterations, modifications, and improvements will readily occur to those skilled in the art. Such alterations, modifications, and improvements are intended to be within the spirit and scope of the invention. Accordingly, the foregoing description is by way of example only and is not intended as limiting. The invention is limited only as defined in the following claims and the equivalents thereto.

What is claimed is:

1. A redundancy management method, for non-volatile memories, comprising the steps of:

enabling a matrix memory line, as a consequence of the presence of a pulsed read address transition signal pulse and throughout the duration of said pulsed read address transition signal pulse, independently from the presence of a redundancy line read signal, and blocking the terminal selection of redundancy lines of the memory; and at the end of the pulsed read address transition signal pulse, when the redundancy line read signal is absent, confirming selection of the lines of the memory matrix and blocking selection of the redundancy lines, and when a redundancy line read signal is present, disabling selection of the lines of the memory matrix and releasing selection of the redundancy lines.

2. The method according to claim 1, wherein said step for the selection of said lines of the memory matrix is independent of the type of previous reading performed on the memory matrix.

3. The method according to claim 1, wherein selection and deselection of said redundancy lines occurs with transitions that are faster than selection and deselection of said lines of the memory matrix.

4. A redundancy management architecture, for non-volatile memories, comprising:

a memory matrix line decoder;

a redundancy propagation means;

an address bus that is connected to said line decoder for the selection of a line of a memory matrix and to a register structure that is adapted to store redundancy line addresses, for the comparison of a current address of said bus with the redundancy addresses; and a logic redundancy detection means including
first logic means that receive, in input, a redundancy detection signal produced by said redundancy detection means and a pulsed read address transition signal pulse; and
a second logic means that receive, in input, said pulsed read address transition signal pulse and a redundancy signal, and are adapted to block the selection of the redundancy lines, throughout the duration of said pulsed read address transition signal pulse;
said first logic means simultaneously enabling the selection of said redundancy lines.

5. The architecture according to claim 4, wherein said redundancy propagation means comprises means for driving said redundancy lines that are larger than corresponding means for driving said memory matrix lines present in said line decoder.

6. The architecture according to claim 4, wherein an intermediate point of each redundancy line is connected to each one of two ends of said redundancy line so as to short resistive elements present in said redundancy line.

7. The architecture according to claim 4, wherein ends of each one of said redundancy lines are connected to one another so as to short resistive elements present in said redundancy line.

8. The architecture according to claim 4, wherein said first logic means comprise an OR gate.

9. The architecture according to claim 4, wherein said second logic means comprises an AND gate, the read address transition signal in input to said AND gate being inverted beforehand by means of an inverter.

10. The architecture according to claim 4, further comprising pre-decoding means that receives as an input said address bus and has an output connected to said main decoder.

11. A memory including a memory matrix of memory lines, a plurality of redundancy memory lines, and a redundancy management circuit, comprising:

means for selecting a memory matrix memory lines;

means for selecting a redundancy line;

an address bus connected to the means for selecting a memory matrix memory line and to the means for selecting a redundancy line;

means for enabling operation of the means for selecting a memory matrix memory line when the address bus is transitioning and when the means for selecting a redundancy line has not selected a redundancy line; and means for blocking operation of the means for selecting a redundancy line when the address bus is transitioning.

12. The memory of claim 11, further comprising:

means, in the plurality of redundancy memory lines, for reducing a propagation delay of selecting the redundancy memory lines relative to that of selecting the memory matrix memory lines.

13. The memory of claim 11, further comprising:

means, in the means for selecting a redundancy line, for reducing a propagation delay of selecting the redundancy memory lines relative to that of selecting the memory matrix memory lines.

14. A memory including a memory matrix of memory lines, a plurality of redundancy memory lines, and a redundancy management circuit, comprising:

a memory matrix memory line decoder;

a redundancy line decoder;

an address bus connected to the memory line decoder and to the redundancy line decoder;

a first logic circuit connected between the redundancy line decoder and the memory line decoder, having an output which enables the memory line decoder when the address bus is transitioning and when the redundancy line decoder has not decoded a redundancy line; and a second logic circuit connected to the redundancy line decoder, having an output which blocks decoding of a redundancy line by the redundancy line decoder when the address bus is transitioning.

15. The memory of claim 14, including an address transition detect signal, wherein the first logic circuit is an OR gate receiving as inputs the address transition detect signal and an output of the redundancy line decoder indicative of a redundancy line detection.

16. The memory of claim 14, including any address transition detect signal, wherein the second logic circuit is an AND gate receiving as inputs the address transition detect signal and an output of the redundancy line decoder indicative of a redundancy line detection.

17. The memory of claim 14, further comprising:

means, in the plurality of redundancy memory lines, for reducing a propagation delay of selecting the redundancy memory lines relative to that of selecting the memory matrix memory lines.

* * * * *